US00RE45117E

(19) United States
(12) Reissued Patent
Kang et al.

(10) Patent Number: US RE45,117 E
(45) Date of Reissued Patent: Sep. 9, 2014

(54) PANEL TYPE DISPLAY DEVICE

(75) Inventors: Joon Kang, Seoul (KR); Jin Hyun Cho, Seoul (KR); Jeong Su Lim, Suwon-si (KR)

(73) Assignee: Samsung Electronics Co., Ltd., Suwon-si (KR)

(21) Appl. No.: 13/403,559

(22) Filed: Feb. 23, 2012

Related U.S. Patent Documents

Reissue of:
(64) Patent No.: 7,667,964
Issued: Feb. 23, 2010
Appl. No.: 11/872,057
Filed: Oct. 15, 2007

(30) Foreign Application Priority Data

Jan. 8, 2007 (KR) ..... 10-2007-0002081

(51) Int. Cl.
*H05K 7/20* (2006.01)

(52) U.S. Cl.
USPC ..... 361/692; 361/679.46; 361/679.48; 361/695; 361/697; 313/582; 349/58

(58) Field of Classification Search
USPC ..... 361/679.46–679.54, 690–697, 361/714–724; 165/80.3, 104.33, 121–126, 165/185; 454/184; 349/58–61; 313/17, 46, 313/582, 584; 345/82–87, 156, 905
See application file for complete search history.

(56) References Cited

U.S. PATENT DOCUMENTS

| | | | | |
|---|---|---|---|---|
| 4,980,848 | A | 12/1990 | Griffin et al. | |
| 5,869,919 | A | 2/1999 | Sato et al. | |
| 5,971,566 | A | 10/1999 | Tani et al. | |
| 6,104,451 | A | 8/2000 | Matsuoka et al. | |
| 6,198,222 | B1 * | 3/2001 | Chang | 313/582 |
| 6,833,674 | B2 | 12/2004 | Kaneko et al. | |
| 7,164,586 | B2 * | 1/2007 | Lin | 361/714 |
| 7,224,121 | B2 | 5/2007 | Ahn | |
| 7,269,009 | B2 | 9/2007 | Ryu et al. | |
| 7,369,400 | B2 | 5/2008 | Bang et al. | |
| 2007/0081109 | A1 | 4/2007 | Igarashi | |

FOREIGN PATENT DOCUMENTS

| | | | |
|---|---|---|---|
| JP | 2001264754 | A | 9/2001 |
| JP | 2003-75858 | A | 3/2003 |
| JP | 2006162641 | A | 6/2006 |

* cited by examiner

*Primary Examiner* — Michail V Datskovskiy
(74) *Attorney, Agent, or Firm* — Sughrue Mion, PLLC

(57) ABSTRACT

A panel type display device for minimizing temperature increase in the interior of a case and a display panel. The display device includes a case, a display panel mounted in an interior of the case, at least one circuit board for controlling the display panel, a first cooling fluid path for cooling the display panel, and a second cooling fluid path for cooling the circuit board. In the display device, the first and second cooling fluid paths are separated from each other.

23 Claims, 3 Drawing Sheets

AMENDED

PANEL TYPE DISPLAY DEVICE

Matter enclosed in heavy brackets [ ] appears in the original patent but forms no part of this reissue specification; matter printed in italics indicates the additions made by reissue.

CROSS-REFERENCE TO RELATED APPLICATIONS

This application claims priority from Korean Patent Application No. 10-2007-0002081, filed on Jan. 8, 2007, in the Korean Intellectual Property Office, the disclosure of which is incorporated herein by reference.

BACKGROUND OF THE INVENTION

1. Field of the Invention

Apparatuses consistent with the present invention relate generally to a panel type display device and, more particularly, to a panel type display device capable of minimizing temperature increase in the interior of a case and a display panel.

2. Description of the Related Art

A panel type display device, such as a Liquid Crystal Display (LCD) or a Plasma Display Panel (PDP), has a flat type panel on which images are displayed. The panel type display device has a thinner thickness and a lighter weight as compared with those of a conventional cathode ray tube (CRT) display device.

As disclosed in Japanese Patent Unexamined Publication No. 2006-162641, such a display device includes a case having front and rear cases, a display panel mounted in an interior of the case, and circuit boards mounted in the interior of the case to be electrically connected to the display panel. Air inlets through which air flows are formed at a lower portion of the rear case, and air outlets through which air is exhausted are formed at an upper portion of the rear case. Air flowing through the lower air inlets cools down the display panel and the circuit boards in the interior of the case, and is then exhausted through the upper air outlets.

However, in such a display device, a display panel and circuit boards, from which heat is produced, are mounted in the same space, such as the interior of a case. For this reason, there is a problem in that the internal temperature of the case is increased due to inter-heating between the display panel and the circuit boards. Such a temperature increase causes the surface temperature of a display panel to be increased. In the case of an LCD panel, the temperature increase causes deterioration of the liquid crystal.

SUMMARY OF THE INVENTION

Accordingly, the present invention has been made to address the above-mentioned problems occurring in the related art, and an aspect of the present invention is to provide a panel type display device capable of minimizing temperature increase in the interior of a case and a display panel.

Therefore, according to an aspect of the present invention, there is provided a panel display device, which includes: a case; a display panel mounted in an interior of the case; at least one circuit board which controls the display panel; a first cooling fluid path which cools the display panel; and a second cooling fluid path which cools the circuit board, wherein the first and second cooling fluid paths are separated from each other.

Further, the case may include front and rear cases coupled to each other, and the rear case may include a circuit board mounting part provided on an outer surface of the rear case such that the circuit board is mounted in the circuit board mounting part.

Furthermore, the circuit board mounting part may have an open rear while being recessed from the outer surface of the rear case such that the circuit board is mounted in the circuit board mounting part, and a cover for covering the circuit board mounting part, on which a plurality of air flow holes are formed, may be mounted on the circuit board mounting part.

In addition, the first cooling fluid path may include a space between a rear surface of the display panel and an inner surface of the rear case, and the second cooling fluid path may include an internal space of the circuit board mounting part.

Further, air inlets through which air flows in the first cooling fluid path may be formed at a lower portion of the rear case, and air outlets through which air is exhausted from the first cooling fluid path may be formed at an upper portion of the rear case.

According to another aspect of the present invention, there is provided a panel type display device, which includes: a case; a partition plate for partitioning an interior of the case into first and second cooling fluid paths; a display panel mounted between the partition plate and a front surface of the case to be cooled by air flowing in the first cooling fluid path; and at least one circuit board mounted between the partition plate and a rear surface of the case to be cooled by air flowing in the second cooling fluid path.

BRIEF DESCRIPTION OF THE DRAWINGS

The above and other aspects, features and advantages of the present invention will be more apparent from the following detailed description taken in conjunction with the accompanying drawings, in which.

DETAILED DESCRIPTION OF EXEMPLARY EMBODIMENTS

Hereinafter, exemplary embodiments of the present invention will be described with reference to the accompanying drawings.

Figure 1:
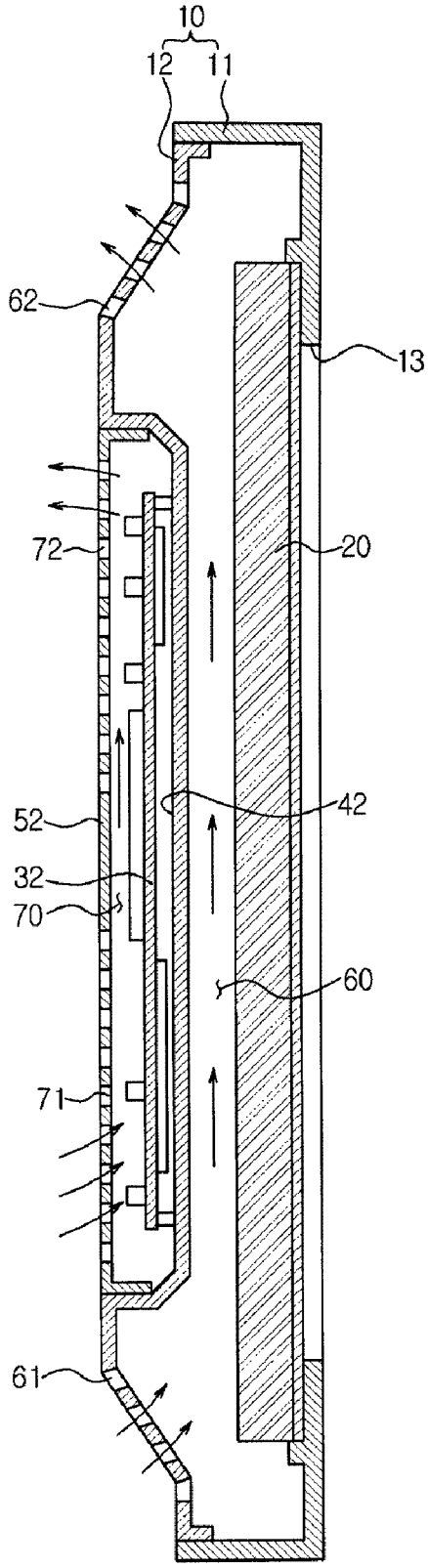
FIG. 1 is sectional view of a panel type display device according to a first exemplary embodiment of the present invention.
Figure 2:
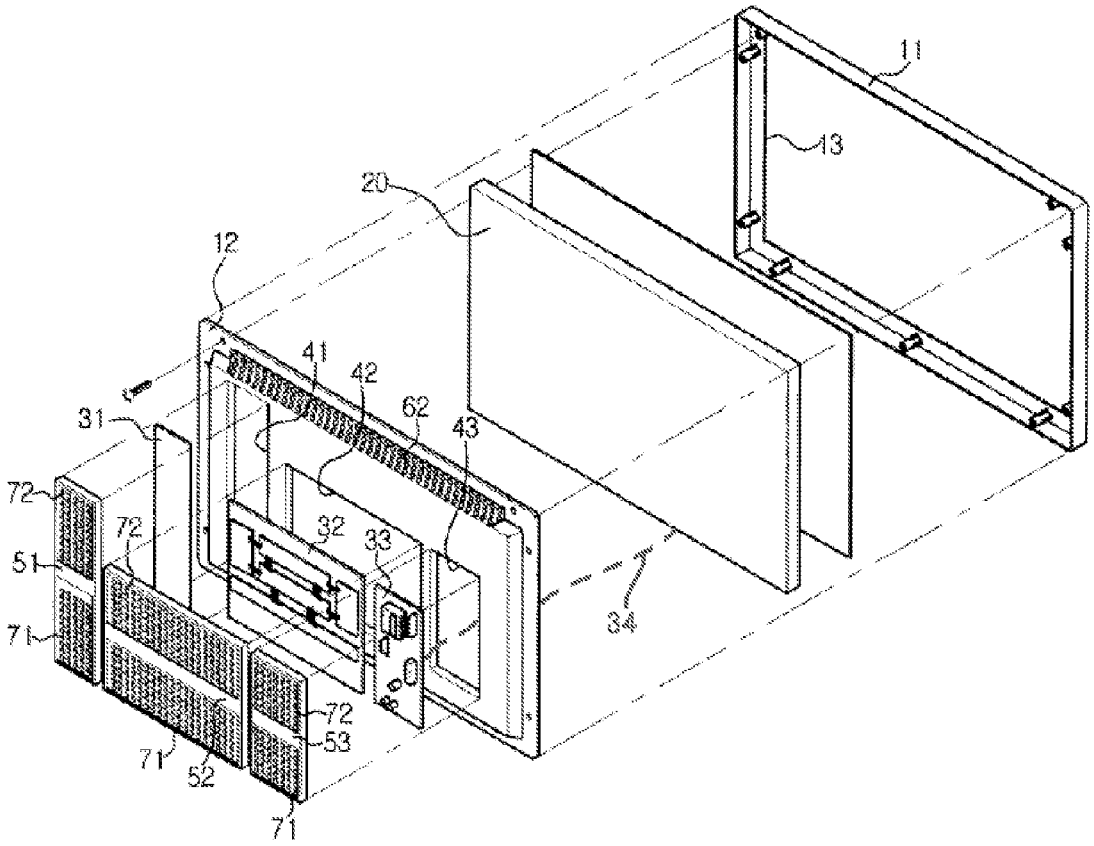
FIG. 2 is an exploded perspective view of the panel type display device according to the first exemplary embodiment of the present invention.

FIGS. 1 and 2 illustrate a panel type display device according to a first embodiment of the present invention. The display device includes a case 10, a display panel 20 mounted at an inner front of the case 10, and a plurality of circuit boards 31, 32 and 33 mounted at a rear of the case 10.

The case 10 includes a front case 11 coupled to the display panel 20 at a front thereof and having an opening 13 formed at a screen portion, and a rear case 12 of which an edge portion is coupled to the front case 11 at a rear of the display panel 20.

The display panel 20 may be an LCD or a PDP. The circuit substrates 31, 32 and 33 are electrically connected to the display panel 20 through a flexible wiring part *34* ([not] shown *in phantom*). A plurality of electronic components are mounted on the circuit substrates 31, 32 and 33. The plurality of electronic components constitute a driving circuit for controlling light emission of the display panel 20, a control circuit, a tuning circuit, a power circuit and the like.

As illustrated in FIG. 2, circuit board mounting parts 41, 42 and 43 for respectively mounting the circuit boards 31, 32 and 33 are provided on a rear surface of the rear case 12. Each of the circuit board mounting parts 41, 42 and 43 has an open rear while being recessed in a predetermined depth from rear to front of the rear case 12 such that the circuit boards 31, 32 and 33 can be received in the circuit board mounting parts 41, 42 and 43, respectively. Further, covers 51, 52 and 53 for covering the circuit board mounting parts 41, 42 and 43 are mounted thereon, respectively.

As illustrated in FIG. 1, a plurality of air inlets 61 through which air for cooling the display panel 20 can flow in an interior of the case 10 are formed at a lower portion of the rear case 12, and a plurality of air outlets 62 through which air in the interior of the case 10 can be exhausted are formed at an upper portion of the rear case 12. Further, as illustrated in FIG. 2, a plurality of air flow holes 71 and 72 through which air can flow in internal spaces of the circuit board mounting parts 41, 42 and 43 are formed on the covers 51, 52 and 53 for respectively covering the circuit board mounting parts 41, 42 and 43.

As illustrated in FIG. 1, such components independently constitute a first cooling fluid path 60 for cooling the display panel 20 and second cooling fluid paths 70 for respectively cooling the circuit boards 31, 32 and 33. That is, the first cooling fluid path 60 is formed by a space between a rear surface of the display panel 20 and an inner surface of the rear case 12, and the second cooling fluid paths 70 are respectively formed by internal spaces of the circuit board mounting parts 41, 42 and 43 of the rear case 12. Thus, the first and second cooling fluid paths 60 and 70 are separated from one another.

Therefore, the display panel 20 is cooled by air flowing along the first cooling fluid path 60. Air flowing in through the air inlets 61 cools the display panel 20 while rising along the first cooling fluid path 60, and is then exhausted through the upper air outlets 62. Further, each of the circuit boards 31, 32 and 33 is cooled by air flowing in an interior of the second cooling fluid path 70 through the air flow holes 71 and 72 formed on each of the covers 51, 52 and 53. Air flowing in the first and second cooling fluid paths 60 and 70 respectively cools the display panel 20 and the circuit boards 31, 32 and 33 while flowing from bottom to top of the first and second cooling fluid paths 60 and 70 due to a natural convection phenomenon.

In such a cooling structure, heat produced from the circuit boards 31, 32 and 33 can be discharged through the second cooling fluid paths 70 without influencing the display panel 20, and heat produced from the display panel can also be discharged through the first cooling fluid path 60 without influencing the circuit boards 31, 32 and 33. Accordingly, the display panel 20 and the circuit boards 31, 32 and 33 can be smoothly cooled, and thus temperature increase in the interior of the case 10 can be minimized. As an experimental result, such a cooling structure enabled a temperature of a front portion of the display panel to be dropped by about 5 to 7° C. as compared with a cooling structure of the conventional display device.

In FIG. 2, the circuit board mounting parts 41, 42 and 43 are recessed from rear to front of the rear case 12. However, the present invention is not limited thereto but may be implemented in such a manner that circuit boards are mounted to protrude from an outer surface of a rear case, and respectively covered with covers.

Figure 3:
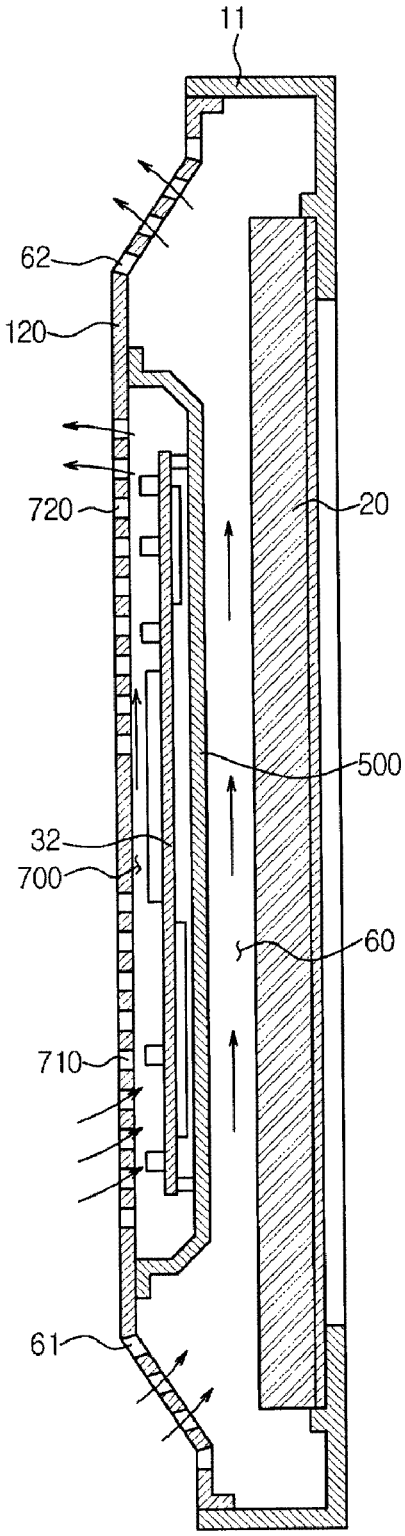
FIG. 3 is a sectional view of a panel type display device according to a second exemplary embodiment of the present invention.

FIG. 3 is a sectional view of a panel type display device according to a second exemplary embodiment of the present invention. In the second embodiment, a partition plate 500 for partitioning a cooling fluid path is mounted on an inner surface of a rear case 120. Thus, in the state in which circuit boards 32 are mounted on an inner surface of the partition plate 500, the partition plate 500 can be mounted on the inner surface of the rear case 120. That is, a circuit board mounting part is replaced by the partition plate 500. Further, a plurality of air flow holes 710 and 720 for air flow of a second cooling fluid path 700 are formed on the rear case 120. A first cooling fluid path 60 and air inlets and outlets 61 and 62 respectively formed at lower and upper portions of the rear case 120 are identical with those of the first embodiment. That is, the first and second cooling fluid paths 60 and 700 are separated from each other by the partition plate 500 mounted on the inner surface of the rear case 120 in the second embodiment.

As described above, in a panel type display device consistent with the present invention, first and second cooling fluid paths for respectively cooling a display panel and circuit boards are separated from each other, thereby preventing a phenomenon in which the circuit boards are heated by the heat of the display panel or the display panel is heated by the heat of the circuit boards. Accordingly, there is an advantage in that the cooling efficiency for the display panel and the circuit boards is enhanced, so that temperature increase in the interior of a case and the display panel can be minimized.

Although exemplary embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A panel display device comprising:

a case;

a display panel mounted in an interior of the case;

at least one circuit board which controls the display panel;

a first cooling fluid path which cools the display panel; and a second cooling fluid path which cools the circuit board, wherein the first and second cooling fluid paths are separated from each other, and wherein the case includes a circuit board mounting part provided on a rear surface of the case and partitioned from a space in which the display panel is mounted such that the circuit board is received in the circuit board mounting part, the first cooling fluid path includes a space between a rear surface of the display panel and an inner surface of the case, and the second cooling fluid path includes an internal space of the circuit board mounting part.

2. The panel display device as claimed in claim 1, wherein the case includes front and rear cases coupled to each other, and the rear case includes a circuit board mounting part provided on an outer surface of the rear case such that the circuit board is mounted in the circuit board mounting part.

3. The panel display device as claimed in claim 2, wherein the circuit board mounting part has an open rear while being recessed from an outer surface of the rear case such that the circuit board is mounted in the circuit board mounting part, and a cover for covering the circuit board mounting part, on which a plurality of air flow holes are formed, is mounted on the circuit board mounting part.

4. The panel display device as claimed in claim 3, wherein the first cooling fluid path includes a space between a rear surface of the display panel and an inner surface of the rear case, and the second cooling fluid path includes an internal space of the circuit board mounting part.

5. The panel display device as claimed in claim 2, wherein the first cooling fluid path includes a space between a rear surface of the display panel and an inner surface of the rear case, and the second cooling fluid path includes an internal space of the circuit board mounting part.

6. The panel display device as claimed in claim 4, wherein air inlets through which air flows in the first cooling fluid path are formed at a lower portion of the rear case, and air outlets through which air is exhausted from the first cooling fluid path are formed at an upper portion of the rear case.

7. The panel display device as claimed in claim 2, wherein a cover for covering the circuit board mounting part, on which a plurality of air flow holes are formed, is mounted on an outer rear surface of the rear case, the first cooling fluid path includes a space between a rear surface of the display panel and an inner surface of the rear case, and the second cooling fluid path includes a space confined by the circuit board mounting part and the cover.

8. A panel display device comprising:

a case;

a partition plate for dividing an interior of the case into first and second cooling fluid paths;

a display panel mounted between the partition plate and a front surface of the case to be cooled by air flowing in the first cooling fluid path; and at least one circuit board mounted between the partition plate and a rear surface of the case to be cooled by air flowing in the second cooling fluid path wherein at least one circuit board is mounted to a circuit board mounting part provided on a rear surface of the case, wherein the partition plate divides the case into a first space in which the display panel is mounted and a separate second space in which the circuit board is mounted, and wherein the first cooling path comprises the space between a rear surface of the display panel and an inner surface of the case and the second cooling path comprises the space in which the circuit board is mounted.

9. The panel display device as claimed in claim 8, wherein air inlets and outlets are formed at lower and upper portions of the case, respectively, for allowing air to flow into the first cooling fluid path.

10. The panel display device as claimed in claim 8, wherein a plurality of air flow holes through which air flows are formed on the rear surface of the case for allowing air to flow into the second cooling fluid path.

*11. A panel display device comprising:*

*a display panel;*

*a front case configured to be disposed in front the display panel and adapted for viewing of a screen portion of the display panel;*

*a rear case coupled to the front case, the rear case defining a rear surface of the panel display device and an edge portion extending from periphery thereof;*

*a circuit substrate including a circuit board with a heat generating side having a plurality of electronic components mounted thereto;*

*a first cooling fluid path which cools the display panel; and*

*a second cooling fluid path which cools the circuit substrate,*

*wherein the first and second cooling fluid paths are separated from each other such that air flow from the second cooling fluid path to the first cooling fluid path is prohibited,*

*a circuit board mounting part provided on the rear case and adapted for mounting the circuit substrate thereto;*

*wherein the circuit substrate is mounted to the rear case via the circuit board mounting part such that the heat generating side of the circuit board having the electronic components face in a direction away from the display panel,*

*wherein the first cooling fluid path comprises a first space located behind a rear surface of the display panel and in front of the circuit board and the second cooling fluid path comprises a second space located at an internal space of the circuit board mounting pad behind the heat-generating side of the circuit board and in front the rear case, and*

*wherein the rear case and the circuit board mounting part are fixed to each other and the rear case is located behind the circuit substrate, and*

*wherein the circuit substrate mounted to the rear case and the display panel moves apart away from each other automatically upon detaching the rear case from the front case.*

*12. The panel display device as claimed in claim 11, wherein the circuit substrate is mounted to the rear case such that at least heat-generating components mounted to the circuit board face in the direction away from the display panel,*

*wherein the at least heat-generating components facing away from the display panel comprises at least one of a driving circuit for controlling light emission of the display panel, a control circuit, a tuning circuit, and a power circuit.*

*13. The panel display device as claimed in claim 11, wherein the circuit substrate is mounted to the rear case such that at least heat-generating components mounted to the circuit board face in the direction away from the display panel,*

*wherein the at least heat-generating components facing away from the display panel comprises a power circuit.*

*14. The panel display device as claimed in claim 11, further comprising a plurality of circuit substrates, wherein at least one of the circuit substrates is electrically connected to the display panel through a flexible wiring part.*

*15. The panel display device as claimed in claim 11, wherein the rear side vertical wall portion of the rear case comprises a central region that is substantially parallel to the display panel, an upper angled region located above the central region and a lower angled region located below the central region.*

*16. The panel display device as claimed in claim 15, wherein the central region of the rear side vertical wall portion comprises a rear cover for covering at least one of the circuit substrates.*

*17. The panel display device as claimed in claim 11, wherein the rear side vertical wall portion of the rear case comprises a rear cover for covering at least one of the circuit substrates.*

*18. The panel display device as claimed in claim 11, wherein the one or more circuit board mounting part is coupled to the rear case, wherein the circuit substrates are supported by the one or more circuit board mounting part.*

*19. The panel display device as claimed in claim 11, wherein the circuit board mounting part provided on the rear case includes a region which is partitioned from another region in which the display panel is located.*

*20. The panel display device as claimed in claim 17, wherein the circuit board mounting part has an open rear while being recessed such that at least one the circuit substrates is mounted in the circuit board mounting part, and the rear cover is configured for covering the circuit board mounting part.*

*21. The panel display device as claimed in claim 11, wherein the rear case includes a plurality of air flow holes formed at a lower portion of the rear case through which air flows into and out thereof.*

*22. The panel display device as claimed in claim 11, wherein the rear case includes a plurality of air flow holes formed at an upper portion of the rear case through which air flows into and out thereof.*

*23. The panel display device as claimed in claim 11, wherein the first and second cooling fluid paths are entirely separated from each other such that air flow from the second cooling fluid path to the first cooling fluid path entirely prohibited.*

* * * * *